United States Patent
Albert et al.

(10) Patent No.: US 10,349,540 B2
(45) Date of Patent: Jul. 9, 2019

(54) MECHATRONIC COMPONENT AND METHOD FOR THE PRODUCTION THEREOF

(71) Applicant: Conti Temic microelectronic GmbH, Nürnberg (DE)

(72) Inventors: Andreas Albert, Höchstadt/Aisch (DE); Andreas Plach, Forchheim (DE); Thomas Schmidt, Burglengenfeld (DE); Bernhard Schuch, Neusitz (DE); Martin Steinau, Nürnberg (DE); Matthias Wieczorek, Neunkirchen am Sand (DE); Mathias Strecker, Crailsheim (DE)

(73) Assignee: CPT Zwei GmbH, Hannover (DE)

( * ) Notice: Subject to any disclaimer, the term of this patent is extended or adjusted under 35 U.S.C. 154(b) by 0 days.

(21) Appl. No.: 15/674,236

(22) Filed: Aug. 10, 2017

(65) Prior Publication Data
US 2017/0367200 A1 Dec. 21, 2017

Related U.S. Application Data

(63) Continuation of application No. PCT/EP2016/052096, filed on Feb. 1, 2016.

(30) Foreign Application Priority Data

Feb. 10, 2015 (DE) .......... 10 2015 202 311
May 20, 2015 (DE) .......... 10 2015 209 191

(51) Int. Cl.
*H05K 5/00* (2006.01)
*H05K 5/06* (2006.01)

(52) U.S. Cl.
CPC .......... *H05K 5/0082* (2013.01); *H05K 5/065* (2013.01); *H01L 2224/48091* (2013.01); *H01L 2924/181* (2013.01)

(58) Field of Classification Search
CPC .......... H05K 5/00; H05K 5/02; H05K 5/0082; H05K 5/065; H05K 5/0095; H05K 5/0213;
(Continued)

(56) References Cited

U.S. PATENT DOCUMENTS 5,313,365 A * 5/1994 Pennisi ............... H01L 23/293
                                                       174/521
5,909,915 A    6/1999 Okuda
(Continued)

FOREIGN PATENT DOCUMENTS

CN    1443034    12/1899
CN    1123515 C    5/1996
(Continued)

OTHER PUBLICATIONS

International Search Report and Written Opinion dated Mar. 5, 2016 from corresponding International Patent Application No. PCT/EP2016/052096.
(Continued)

*Primary Examiner* — Angel R Estrada

(57) ABSTRACT

The disclosure relates to a mechatronic assembly. The assembly includes a supporting circuit board with at least one populated flat side. A multiplicity of electronic components are arranged on the at least one populated flat side. In addition, at least one mechanical insert part for the mechanical fixing of at least one electronic component is also arranged on the at least one populated flat side. An encapsulation of one-piece design is provided which, in form-fitting and cohesive fashion, surrounds all of the components arranged on the at least one populated flat side of the supporting circuit board. The disclosure also relates to a method for producing the mechatronic assembly.

11 Claims, 3 Drawing Sheets

(58) Field of Classification Search
CPC ........ H05K 5/0217; H05K 5/06; H05K 5/062; H01L 2224/48091; H01L 2924/181
USPC ... 174/521, 520, 535, 50, 50.52, 50.5, 50.51
See application file for complete search history.

(56) References Cited

U.S. PATENT DOCUMENTS

| | | | |
|---|---|---|---|
| 6,865,084 B2* | 3/2005 | Lin | H01L 23/3128 174/521 |
| 7,227,086 B2* | 6/2007 | Lee | H01L 24/48 174/521 |
| 7,514,784 B2* | 4/2009 | Mayuzumi | H05K 5/065 361/704 |
| 7,834,275 B2* | 11/2010 | Launay | H01L 23/49855 174/259 |
| 7,897,234 B2* | 3/2011 | Selverian | H05K 5/064 174/521 |
| 8,110,755 B2* | 2/2012 | Takayama | H01L 23/3121 174/521 |
| 8,130,496 B2* | 3/2012 | Dong | H01L 23/24 174/521 |
| 8,804,316 B2* | 8/2014 | Shiraki | G01C 19/5783 174/520 |
| 2009/0056446 A1 | 3/2009 | Cluff et al. | |

FOREIGN PATENT DOCUMENTS

| | | |
|---|---|---|
| CN | 103262674 A | 8/2013 |
| DE | 102005063279 A1 | 7/2007 |
| DE | 102011006594 A1 | 10/2012 |
| DE | 102011006632 A1 | 10/2012 |
| DE | 102014205386 A1 | 9/2015 |
| JP | 2000208905 A | 7/2000 |
| JP | 2012028487 A | 2/2012 |
| JP | 2014168983 A | 9/2014 |
| JP | 2014187063 A | 10/2014 |
| WO | WO2006066983 A1 | 6/2006 |

OTHER PUBLICATIONS

German Office Action dated Sep. 16, 2015 for corresponding German Patent Application No. 10 2015 209 191.0.
Japanese Office Action dated Aug. 6, 2018 for corresponding Japanese Application No. 2017-541950.
Chinese Office Action dated Jan. 23, 2019 for corresponding Chinese application No. 201680003896.6.
German Office Action dated Apr. 17, 2019 for corresponding German Patent Application No. 10 2015 209 191.0.

* cited by examiner

MECHATRONIC COMPONENT AND METHOD FOR THE PRODUCTION THEREOF

CROSS-REFERENCE TO RELATED APPLICATIONS

This application claims the benefit of PCT Application PCT/EP2016/052096, filed Feb. 1, 2016, which claims priority to German Application DE 10 2015 202 311.7, filed Feb. 10, 2015 and German Application DE 10 2015 209 191.0 May 20, 2015. The disclosures of the above applications are incorporated herein by reference.

TECHNICAL FIELD

The disclosure relates to a mechatronic assembly and a method for the production of a mechatronic assembly.

BACKGROUND

Mechatronic assemblies in the form of integrated circuits generally include electronic components, which are combined on a supporting circuit board to form an electric circuit arrangement, together with mechanical components to which e.g., sensors are fitted. Alternatively, the electronic components can be connected by means of a punch grid, which is accommodated in an enclosure. According to the prior art, these mechatronic assemblies are fitted, by means of connecting elements, to a baseplate, e.g., of aluminum construction, which serves for a mechanical stabilization and heat evacuation of the mechatronic assembly. Mechatronic assemblies of this type are employed, for example, as control devices in motor vehicles, such as a transmission control device.

Control devices are customarily protected against external influences, such as motor oil, by covers. In this case, seals, adhesive bonds or cohesive connections are provided between the supporting circuit board and the cover.

For example, modular electronic assemblies and electronic components arranged on the supporting circuit board are each enclosed in a separate housing.

Electrical contacting of the electronic assemblies and electronic components is effected, for example, by a punch grid, having electrical connector pins configured along a mold separation line of the cavity. Alternatively, electrical contacting is effected by means of reverse-side contacting with a circuit board element those projects out of the plastic housing.

The dimensions of electronic components encapsulated in plastic range from the order of a few millimeters, in the case of microchips, up to several centimeters for complete electronic assemblies on various circuit carriers. In mechatronic assemblies of modular design, brought-out electrical terminals must be protected against metal chips and/or aggressive media. This can be achieved by means of coatings, additional plastic parts or covers. However, these measures are associated with increased production costs.

SUMMARY

Therefore, it is desirable to have an improved mechatronic assembly and a method for the production of a mechatronic assembly.

One aspect of the disclosure provides a mechatronic assembly that includes a supporting circuit board with at least one populated flat side A plurality of electronic components are arranged on the at least one populated flat side. At least one mechanical insert part for the mechanical fixing of at least one electronic component on the supporting circuit board is also arranged on the at least one populated flat side. An encapsulation of one-piece design is provided which, in a form-fitting and cohesive manner, surrounds all of the components arranged on the populated flat side of the supporting circuit board.

Implementations of the disclosure may include one or more of the following optional features. In some implementations, the mechatronic assembly may be used as motor vehicle control device, such as a transmission control device.

In some examples, the supporting circuit board is configured as a circuit carrier, where the electronic components in the form of unhoused semiconductor components (also known as "bare dies") and/or of housed semiconductor components are arranged directly on the flat side of the supporting circuit board. Unhoused semiconductor components are connected to the supporting circuit board, and thus to other electronic components arranged thereupon, by means of electrical connecting elements, such as, for examples, bonding wires, and conductive adhesive joints. Housed semiconductor components are electronic components which are protected against external influences by a molding or housing, and are connected to the supporting circuit board, and thus to other components, by any connection involving soldering or plug-in methods. In some examples, there are three options for the fitting of electronic components to the supporting circuit board. They can either be fitted directly to the supporting circuit board in the form of housed and/or unhoused components. Alternatively, it is possible that unhoused components are fitted to a circuit board element, such as a HDI (high density interconnect) printed circuit board, which is bonded to the supporting circuit board in a cohesive manner by an adhesive bond, such as, for example, using a thermally-conductive adhesive.

The at least one mechanical insert part is a mechanical fixing element, which fixes a position of the electronic component on the supporting circuit board. The mechanical insert part may additionally be employed for the electrical contact and/or reinforcement of the electronic component. For example, a mechanical insert part is a dome sensor.

The encapsulation encloses all the components on the populated flat side of the supporting circuit board in a comprehensive and one-piece arrangement, such that both the electronic components, the at least one mechanical insert part and all further connecting elements for the electrical contacting of electronic components are protected against external influences, such as, for example, chips, motor oil. By the one-piece design of the encapsulation, interspaces between the electronic components are also closed, thus preventing exposed interfaces. Thus, the encapsulation provides an optimum combination of protection for electronics and a housing design with reduced spatial requirements for the mechatronic assembly, in comparison with the prior art. The encapsulation further provides a substantially superior sealing function in comparison with the employment of multiple housings, which require mutual sealing.

In some examples, the encapsulation is formed of a curable encapsulation material, such that the form-fitting and cohesive bond is formed between the encapsulation and the components in an exceptionally simple manner.

In some examples, the curable encapsulation material includes a thermosetting plastic, which has electrical insulating properties, such that a short-circuit between the electronic components is prevented. The thermosetting plastic may be an epoxy-based polymer.

In some implementatins, the encapsulation material incorporates at least one inorganic filler material. Suitable inorganic filler materials include, for example, silicon dioxide or aluminum oxide. A thermal expansion coefficient of the encapsulation may thus be adapted to the supporting circuit board, and specifically to the constituent materials of the supporting circuit board, such that any distortion of the encapsulation can be prevented, or at least reduced. Likewise, the thermal expansion of encapsulation can be adjusted by means of the thermal properties thereof, specifically thermal expansion, rigidity and glass transition temperature.

In some implementations, the encapsulation has at least one reinforcing rib. The reinforcing rib may be configured in the form of a honeycomb structure, or in the form of cruciate ribs. Alternatively, other geometries and/or the employment of a plurality of reinforcing ribs are also possible. The reinforcing rib allows a reinforcement of the mechatronic assembly, as a result of which the baseplate described in the prior art, specifically an aluminum baseplate, can be omitted. A mechanical stability of the mechatronic assembly is thus ensured, even in the event of increased mechanical loading during assembly and/or operation. Alternatively or additionally, another reinforcing structure, such as, for example, a metal grid or plate embedded in a plastic, may be used.

In some implementations, it is provided that the encapsulation additionally at least partially encloses a flat side of the supporting circuit board arranged opposite the populated flat side thereof. The encapsulation thus serves additionally for the reinforcement and protection of an unpopulated reverse side, e.g. for protection against chips. Alternatively, an electronic component or a plurality of electronic components, such as a sensor, can also be arranged on the reverse side, which are protected against external influences by the encapsulation.

In some examples, the mechatronic assembly comprises an electronic circuit arrangement and at least one sensor. The electronic circuit arrangement, for example, is of modular design, and includes a plurality of electrically-interconnected components, which are combined in a circuit. A Hall effect sensor and/or pressure sensor can, for example, be used as the at least one sensor. The mechatronic assembly further includes a number of electrical connecting elements for the electrical contacting of the electronic components with further electronic components, such as, for example, current-carrying parts of a motor vehicle transmission.

In some implementatins, a printed circuit board element, for example an HDI printed circuit board, is arranged between the electronic circuit arrangement and the supporting circuit board. The printed circuit board element may be cohesively connectable to the supporting circuit board by adhesive bonding, for examples, using a thermally-conductive adhesive. The electronic circuit arrangement may include unhoused components, specifically unhoused semiconductor components. Alternatively, the electronic circuit arrangement may be arranged directly on the supporting circuit board. This is possible with either housed or unhoused components.

Another aspect of the disclosure provides a method for the production of a mechatronic assembly, wherei at least one flat side of a supporting circuit board is populated with a plurality of electronic components, and where at least one electronic component is mechanically fixed to the flat side of the supporting circuit board by at least one mechanical insert part. A curable encapsulation material, such as, for example, a thermosetting plastic, specifically epoxy resin, is applied to the plurality of electronic components and the at least one mechanical insert part which, upon curing, bonds with the electronic components and the at least one mechanical insert part in a form-fitting and cohesive manner, and encapsulates the latter in a one-piece arrangement.

The method allows the production and fitting of an encapsulation to the supporting circuit board, which accommodates the plurality of electronic components. In comparison with the prior art, production expenditure and material costs for the encapsulation may be optimized. Moreover, all electrical interfaces on the supporting circuit board are protected by the encapsulation.

In some implementations, the curable encapsulation material is packed in a mold, where the supporting circuit board with its populated flat side, upon which the electronic components and the at least one mechanical insert part are arranged, is immersed in the mold. A media-impermeable, form-fitting and cohesive bond may thus be formed between the cured encapsulation material, the electronic components and the at least one mechanical insert part.

In some examples, the curable encapsulation material is sprayed onto the populated flat side of the supporting circuit board.

By this method, a media-impermeable, form-fitting and cohesive bond can also be formed between the cured encapsulation material, the electronic components and the at least one mechanical insert part.

The details of one or more implementations of the disclosure are set forth in the accompanying drawings and the description below. Other aspects, features, and advantages will be apparent from the description and drawings, and from the claims.

DESCRIPTION OF DRAWINGS

In all the figures, mutually corresponding elements are identified by the same reference symbols. Like reference symbols in the various drawings indicate like elements.

DETAILED DESCRIPTION

Figure 1:
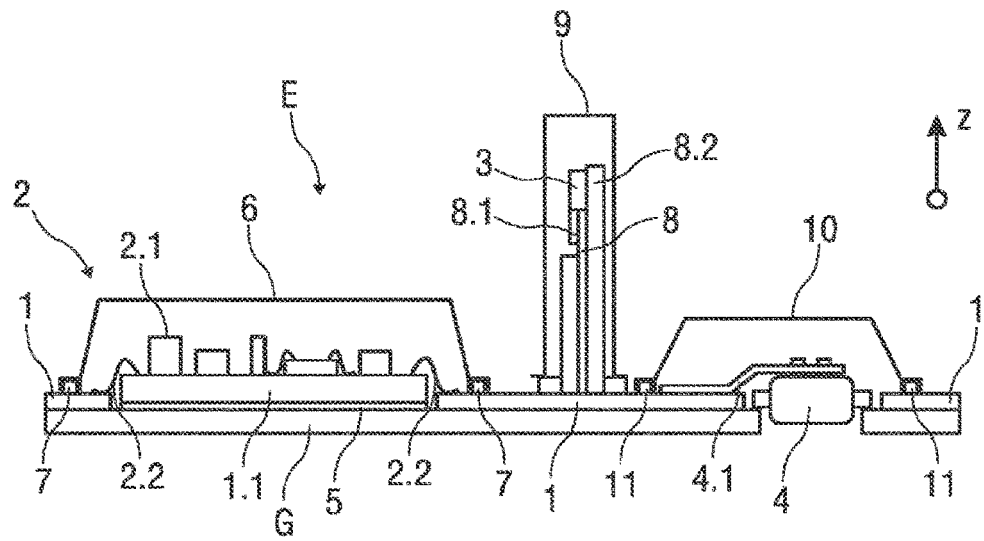
FIG. 1 shows a schematic sectional representation of a mechatronic assembly according to the prior art.

FIG. 1 shows a sectional representation of a mechatronic assembly E according to the prior art. The mechatronic assembly E is designed, for example, as a motor vehicle control device, specifically as a transmission control device. The mechatronic assembly E includes a baseplate G, and a supporting circuit board 1 which, on one flat side, has a first sensor 3 with a first mechanical insert part 8 and a second sensor 4 with a second mechanical insert part 4.1. The mechatronic assembly E further includes a printed circuit board element 1.1, with a modular electric circuit arrangement 2 fitted to one flat side thereof.

The baseplate G serves for the mechanical stabilization of, and the evacuation of heat from electrical components arranged on the supporting circuit board 1 and on the printed circuit board element 1.1, in this case, the first and second sensors 3, 4 and the electronic circuit arrangement 2. The baseplate G can be configured as a metal baseplate, e.g., an aluminum baseplate.

The supporting circuit board 1 is configured as a "surround-flow" printed circuit board, having at least one layer with electrically-conductive printed copper conductors for electrical connection. The supporting circuit board 1 can also be populated on both sides.

The electric circuit arrangement 2 represented is configured in a modular manner on the printed circuit board element 1.1 and includes an electronic assembly 2.1, for example of transistors, electrical resistors, memory chips, etc.

As shown, the electric circuit arrangement 2 is connected to the supporting circuit board 1 in an electrically conductive manner by two bonding wires 2.2. The bonding wires 2.2 are configured, for example, as heavy-gauge aluminum wires or as light-gauge aluminum wires. Alternatively, the bonding wires 2.2 can be formed of gold.

Moreover, in place of two bonding wires 2.2, only a single bonding wire 2.2, or a plurality of bonding wires 2.2 can be provided.

The mechanical connection of the electric circuit arrangement 2 to the baseplate G is effected in a cohesive manner, where the electric circuit arrangement 2 is connected to the baseplate G via the printed circuit board element 1.1. As shown, the printed circuit board element 1.1 is cohesively bonded to the baseplate G by an adhesive 5, e.g., a thermally-conductive adhesive. The printed circuit board element 1.1 is configured, for example, as an "HDI printed circuit board" (high-density-interconnect printed circuit board).

The electric circuit arrangement 2 is enclosed by a first cover element 6, which is arranged for the enclosure of the electric circuit arrangement 2 and the bonding wires 2.2 on the flat side of the supporting circuit board 1. The first cover element 6 is bonded to the flat side of the supporting circuit board 1 in a friction-locked and/or form-fitting and/or cohesive arrangement. As shown, a connecting region is provided between the flat side of the supporting circuit board 1 and the first cover element 6 with a first sealing element 7. The first sealing element 7 can be configured as a solid seal, or alternatively as a spray-on sealant or an adhesive.

The first sensor 3 is arranged on the flat side of the supporting circuit board 1, with a clearance from the electric circuit arrangement 2, and is configured, for example, as a Hall effect sensor, a piezoelectric sensor, or similar. The first mechanical insert part 8 is configured as a hybrid injection-molded component, and includes a metal carrier 8.1 for the electrical connection and mechanical fixing of the first sensor 3, and a plastic cladding 8.2, which electrically insulates part of the first mechanical insert part 8. The first mechanical insert part 8 is bonded to the flat side of the supporting circuit board 1 in a cohesive and/or friction-locked and/or form-fitting manner.

The first sensor 3, together with the first mechanical insert part 8, is enclosed by a second cover element 9 which is arranged on the plastic cladding 8.2. The second cover element 9 is bonded to the first mechanical insert part 8 in a friction-locked and/or form-fitting and/or cohesive manner.

The second sensor 4 is arranged on the flat side of the supporting circuit board 1, with a clearance to the first sensor 3, and is further configured, for example, as a pressure sensor or similar. As shown, the second mechanical insert part 4.1 is configured as a conductor rail, by means of which the second sensor 4 is connected to the supporting circuit board 1 in a mechanical and electrically-conductive manner. The conductor rail can comprise e.g. a foil or an encapsulated punch grid.

The second sensor 4, together with the second mechanical insert part 4.1 is enclosed by a third cover element 10, which is connected to the flat side of the supporting circuit board 1 in a friction-locked and/or form-fitting and/or cohesive manner. Analogously to the first cover element 6, the third cover element 10 is provided with a second sealing element 11 that is arranged on the connecting region between the flat side of the supporting circuit board 1 and the third cover element 10. Analogously to the first sealing element 7, the second sealing element 11 can be configured as a solid seal, or alternatively as a spray-on sealant or an adhesive joint.

The cover elements 6, 9, 10 serve to protect the components on the supporting circuit board 1 against external influences. In other words: the electric circuit arrangement 2, the first sensor 3 and the second sensor 4, and the mechanical insert parts 4.1, 8, are protected by means of the separate cover elements 6, 9, 10, for example against engine oil. For the sealing of the cover elements 6, 9, 10, the first sealing element 7, the second sealing element 11 and the cohesive bond between the plastic cladding 8.2 and the second cover element 9 are provided.

Figure 2:
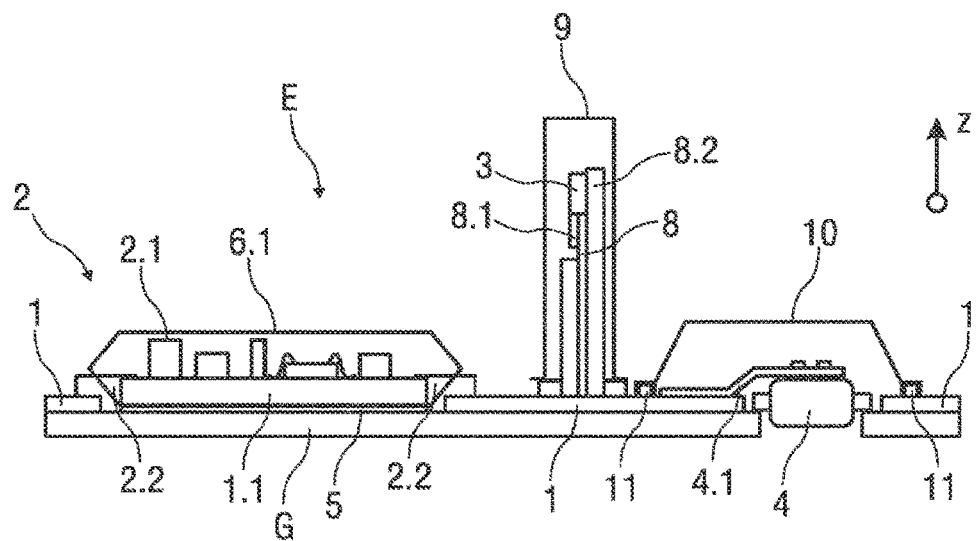
FIG. 2 shows a schematic sectional representation of an alternative mechatronic assembly according to the prior art.

FIG. 2 shows a sectional representation of a mechanical assembly E according to the prior art, of a similar design to that represented in FIG. 1. The design differs in that the electric circuit arrangement 2 on the printed circuit board element 1.1 is protected by a plastic cladding 6.1, rather than by the first cover element 6. The printed circuit board element 1.1 is cohesively bonded to the baseplate G by means of an adhesive 5, here again a thermally-conductive adhesive. As shown, electrical contact with the supporting circuit board 1 is effected by a punch grid or a flexible foil. Alternatively, for electrical contact, the printed circuit board element 1.1 can also be brought-out for direct contacting with the supporting circuit board 1, for example, by soldering. The remaining design of the mechatronic assembly E is analogous to that represented in FIG. 1.

Figure 3:
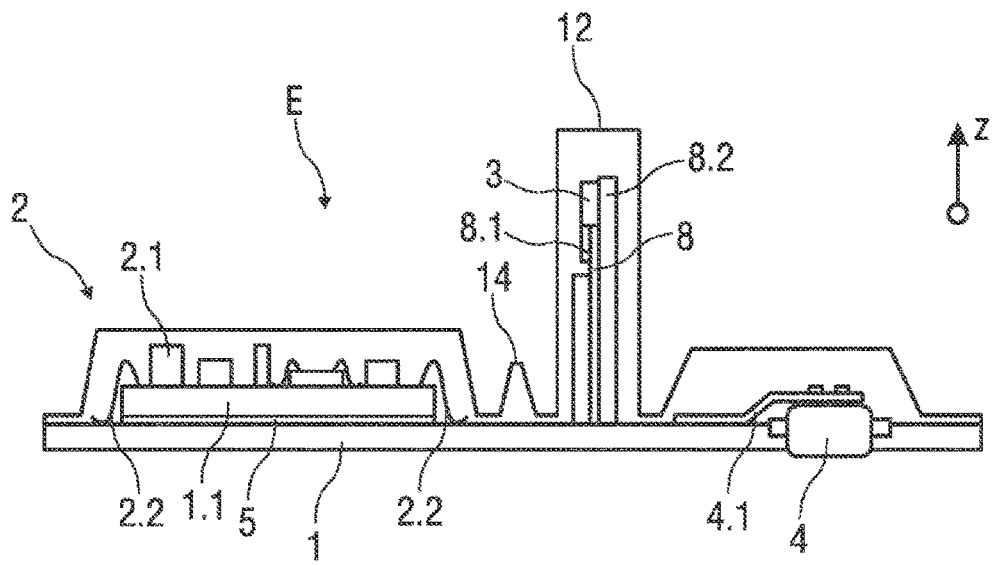
FIG. 3 shows a schematic sectional representation of an exemplary embodiment of a mechatronic assembly according to the invention, in the finished manufactured state.
Figure 4:
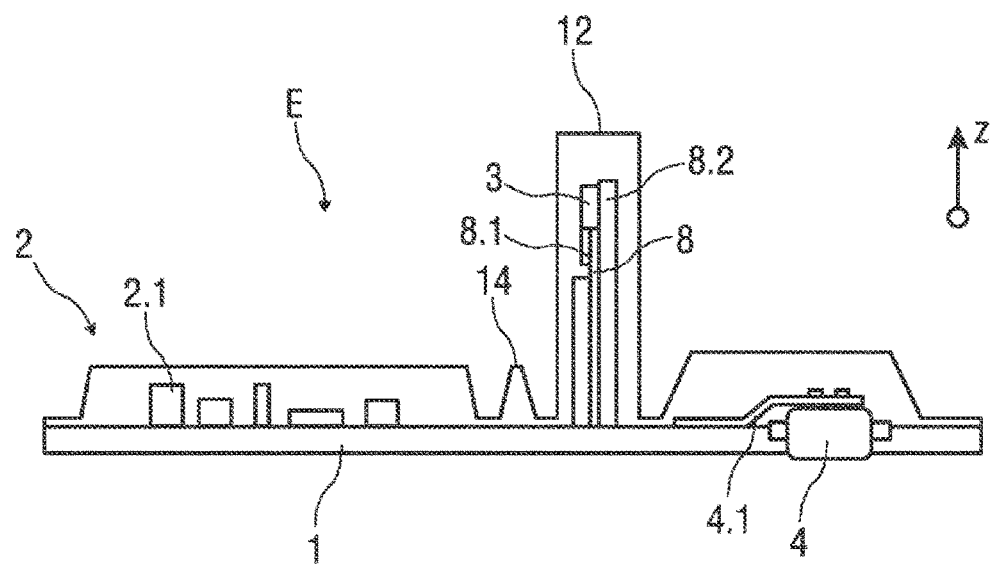
FIG. 4 shows a schematic sectional representation of an alternative exemplary embodiment of a mechatronic assembly according to the invention, in the finished manufactured state.

According to the disclosure, and referring to FIGS. 3 and 4, for the reduction of components, and the provision of a media-impermeable and temperature-resistant seal for components in the mechatronic assembly E, the disclosure provides for an encapsulation 12 of one-piece design, which constitutes a common enclosure for all the components arranged on the supporting circuit board 1. With respect to the below description of FIGS. 3 and 4, this means the following: the electric circuit arrangement 2, the first sensor 3 and the second sensor 4, with their associated mechanical insert parts 4.1, 8, are protected against external influences by a common encapsulation 12.

FIG. 3 shows a sectional representation of a mechatronic assembly E with an encapsulation 12 according to the disclosure. The mechatronic assembly E includes the electric circuit arrangement 2, the first sensor 3 and the second sensor 4 and their associated mechanical insert parts 4.1, 8, as described above. The encapsulation 12 further includes a reinforcing rib 14. In some examples, the reinforcing rib 14 is configured in the form of a honeycomb structure or in the form of cruciate ribs. Alternatively, a plurality of reinforcing ribs 14 can also be provided.

The cover elements 6, 9, 10 described in FIGS. 1 and 2 are thus not provided. Instead, the components represented are protected against external influences by the one-piece encapsulation 12, which encloses the components in a form-fitting and cohesive manner. The interspaces between the electric circuit arrangement 2 and the sensors 3, 4, with their associated mechanical insert parts 4.1, 8, are also enclosed by the encapsulation 12 such that, due to the absence of exposed interfaces, the security of the mechatronic assembly E, specifically during the operation thereof, is improved in relation to the prior art. Moreover, due to the presence of the reinforcing ribs 14, the baseplate G can be omitted, and heat dissipation from the electric components can be achieved by means of through-connections (also described as thermal vias).

FIG. 4 shows another mechatronic assembly E according to the disclosure. Similar to FIG. 3, the mechatronic assembly E includes the electric circuit arrangement 2 and the sensors 3, 4, with their associated mechanical insert parts 4.1, 8.

The electric circuit arrangement 2 is here thus not connected to the supporting circuit board 1 via a printed circuit board element 1.1, as shown in FIG. 3, but is arranged directly on the flat side of the supporting circuit board 1 and bonded to the latter. The electronic components of the electric circuit arrangement 2 are soldered or glued to the supporting circuit board 1, such that no bonding wires 2.2 are required for electrical connection. Here again, it is possible to employ either housed or unhoused components in the electronic circuit arrangement 2.

Moreover, the electric circuit arrangement 2, the sensors 3, 4 and their associated mechanical insert parts 4.1, 8 are enclosed by the encapsulation 12 in a form-fitting and cohesive manner, as described above with reference to FIG. 3.

The encapsulation 12 is described in detail hereinafter with reference to FIG. 5.

Figure 5:
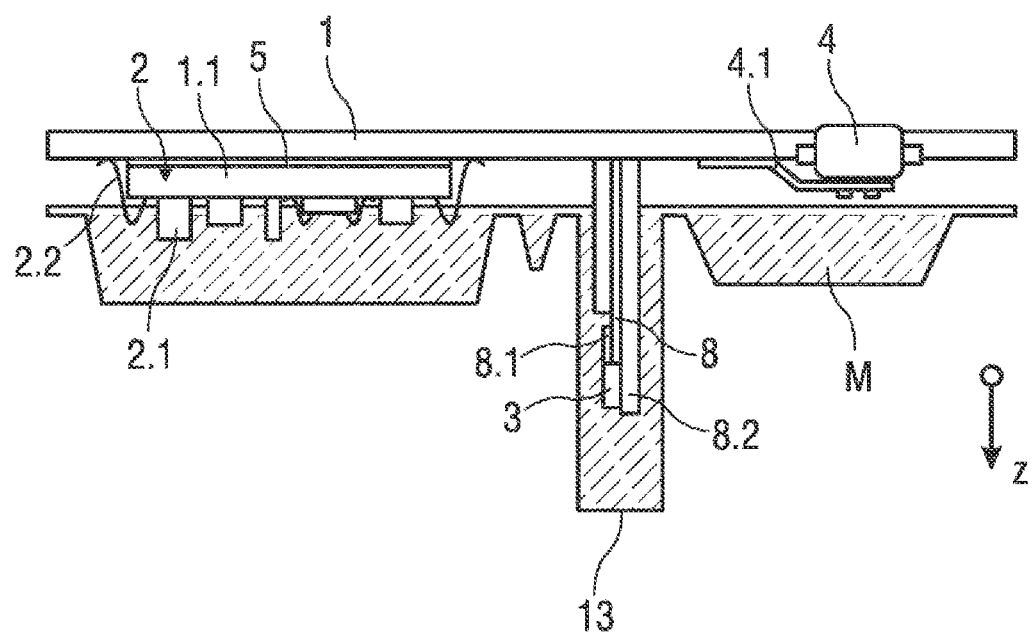
FIG. 5 shows a schematic sectional representation of the mechatronic assembly according to FIG. 3 during a production step.

FIG. 5 shows a sectional representation of the mechatronic assembly E according to FIG. 3, during the production of the encapsulation 12 using a mold 13.

The mold 13 features a simplified negative molding of the populated flat side of the supporting circuit board 1, together with a cavity for the molding of the reinforcing ribs 14. The mold 13 contains an encapsulation material M, which is inserted in the mold 13 in the form of a granulate, or in a liquid form, and is then warmed or heated. Specifically, the encapsulation material M is a thermosetting plastic. The thermosetting plastic is, for example, an epoxy-based polymer, which is mixed with inorganic filler materials. Suitable inorganic filler materials include, for example, silicon dioxide or aluminum oxide. By means of the inorganic filler material a thermal expansion coefficient of the encapsulation 12 can thus be adapted as a function of a filler material quantity to the supporting circuit board 1, and specifically to the constituent materials of the supporting circuit board 1, such that any distortion of the encapsulation 12 is prevented, or at least reduced.

For the production and application of the encapsulation 12, the supporting circuit board 1, with its populated flat side, is immersed in the mold 13, such that the electric circuit arrangement 2, the first sensor 3, the second sensor 4 and their associated mechanical insert parts 4.1, 8 are completely surrounded by the liquid encapsulation material M in the mold 13. The mold is preferably vacuum-sealed.

After a chemical curing and cooling of the liquid encapsulation material M, the encapsulation 12 is bonded to the electric circuit arrangement 2, the first sensor 3, the second sensor 4, their associated mechanical insert parts 4.1, 8 and the flat side of the supporting circuit board 1 in a form-fitting and cohesive manner.

Thus, using a single encapsulation 12, it is possible to enclose both the modular electric circuit arrangement 2 and the sensors 3, 4, with their associated mechanical insert parts 4.1, 8, which are additionally arranged on the supporting circuit board 1. Assembly steps and sealing measures are thus reduced in comparison with the prior art.

The method described for the production and application of the encapsulation 12 is also known as compression molding. Alternatively, transfer molding is also possible, wherein the populated flat side of the supporting circuit board 1 is arranged in the cavity of the molding 13, and the liquid, heated encapsulation material M is then introduced into the molding 13 by a casting duct or piston system, via a duct. A vacuum-tight seal of the mold 13 is not needed for this purpose. Moreover, injection-molding is also possible, where the liquid encapsulation material M is sprayed around the components on the supporting circuit board 1 via a sprue.

In some implementations, the encapsulation 12 is applied to the supporting circuit board 1 by a "sheet molding compound". By this method, a material of the aforementioned composition, in an uncured state, is applied as a film on the populated flat side of the supporting circuit board 1. By a thermal process, the sheet molding compound is firstly melted, whereby the latter assumes a form-fitting position around the components on the supporting circuit board 1 which are to be enclosed, and is then cured. A media-impermeable adhesive bond can thus be formed between the components on the supporting circuit board 1, the supporting circuit board 1 itself and the encapsulation 12. The thermal process may be initiated by a molding tool, in a kiln at normal pressure, or in a vacuum.

In the mechatronic assembly E shown in FIG. 3, with the finished encapsulation 12, a media-impermeable and temperature-resistant bond is formed between the encapsulation 12, the electric circuit arrangement 2, the sensors 3, 4 with their associated metal insert parts 4.1, 8, and the flat side of the supporting circuit board 1.

The disclosure thus permits an optimum combination of protection for electronics and a housing design that forms an extremely flat housing by way of the encapsulation 12. The number of components and process steps for sealing components on the supporting circuit board 1 is thus reduced in relation to the prior art described in FIGS. 1 and 2. This combination is possible as, in comparison with other control devices in which, for example, a ceramic-based substrate is employed, the solution represented uses a uniform organic substrate technology, which can incorporate both logic and power components. Differences in thermal expansion can thus be reduced.

The disclosure has a further advantage, in that the common encapsulation 12 permits any distortion (bimetallic effect) or delamination (thermomechanical stresses associated with differential thermal expansion) to be avoided, or at least reduced.

As a result of the viscosity of the encapsulation material M, the disclosure further permits the arrangement of at least one reinforcement mold on the supporting circuit board 1 which, as shown in FIGS. 3 and 4, is executed in the form of the reinforcing rib 14.

It is thus possible for the mechatronic assembly E shown in FIGS. 3 and 4 to be executed without a metal baseplate G that is show in FIG. 1 or 2, for reinforcement. The mechatronic assembly E provided with the encapsulation 12 can be fitted directly to a transmission housing or a hydraulic plate, for example, by means of screws, rivets, adhesive, lamination or similar. A mechanical stability of the mechatronic assembly E is thus ensured, even in the event of high mechanical loading during assembly and/or in service.

Cooling of the mechatronic assembly E by the evacuation of thermal losses can be achieved, for example, by means of the aforementioned through-connections (thermal vias) which are incorporated in the supporting circuit board 1. Cooling can additionally be achieved by a thermosetting plastic packed with particles of high thermal conductivity, where a double-sided electrical connection of the mechatronic assembly E to further components in the motor vehicle is possible.

It is moreover possible, instead of a uniform encapsulation material M, to employ various encapsulation materials M, which bond together upon heat curing. The encapsulation materials M can have different properties, for example, different thermal expansion coefficients, thermal conductivity coefficients, costs, etc. Cost-optimized material selection for the encapsulation 12 is thus possible.

The disclosure moreover permits a reduction of components and costs in that, by the encapsulation 12, current-carrying parts are protected against chemical reactions with air or the ambient atmosphere. Accordingly, rather than cost-intensive materials such as gold or aluminum for the bonding wires 2.2, metal plating and other conductive parts, uncoated copper can be employed.

By using the encapsulation 12, interspaces in the mechatronic assembly E are also enclosed, such that these are protected against external influences, e.g., the presence of chips between electronic components, which might result in short-circuits, and against chemically corrosive media, e.g., motor oil. Thus, in comparison with the prior art, fixing elements, connecting elements and free spaces on the supporting circuit board 1 are further protected, additionally to the electronic components.

As a result of the aforementioned viscosity of the encapsulation material M, it is further possible for an encapsulation 12 in the form of a plastic layer to be applied e.g., to an unpopulated flat side of the supporting circuit board 1, thereby resulting in an improved adhesion of the encapsulation 12 to the populated flat side, and in an additional reinforcement of the mechatronic assembly E. The double-sided enclosure of the mechatronic assembly E can be achieved by cut-outs arranged in the supporting circuit board 1, or by cut-outs arranged in the region between the printed circuit board element 1.1 and the supporting circuit board 1.

The double-sided enclosure of the mechatronic assembly E may also serve as a cover for potential soldering interfaces, as a result of which the first mechanical insert part 8 of the first sensor 3 is protected against external influences including, for example, chemically corrosive media. As the strength of adhesion of the encapsulation 12 to different surfaces is variable, additional coatings may be applied to printed circuit board surfaces, or activation measures may be applied, to reduce the risk of detachment of the encapsulation 12 from the supporting circuit board 1.

In some implementations, the supporting circuit board 1 can be populated on its opposing flat side which, in the direction of viewing, constitutes a reverse side or underside of the supporting circuit board 1. A thermosetting plastic packed with highly thermally-conductive particles is employed as an encapsulation material M for this purpose. As a result, the cooling of the mechatronic assembly E via the encapsulation 12 can be achieved directly by a temperature-stabilizing unit, such as, for example a hydraulic plate.

Moreover, in addition to reinforcing structures, interruptions in the encapsulation 12, in the form of material cut-outs, where regions of the supporting circuit board 1 are exposed, are also possible. Interruptions are provided, for example, for the purposes of assembly, or for the accommodation of electrical terminals for plug-in connectors.

A number of implementations have been described. Nevertheless, it will be understood that various modifications may be made without departing from the spirit and scope of the disclosure. Accordingly, other implementations are within the scope of the following claims.

What is claimed is:

1. A mechatronic assembly of a gear control arrangement, the mechatronic assembly comprising:
    a supporting circuit board having at least one populated flat side;
    an electric circuit arrangement positioned on the at least one populated flat side, the electric circuit arrangement comprising an electronic assembly;
    a first mechanical insert part arranged on the at least one populated flat side, the first mechanical insert part designed as a hybrid injection-molded part and comprising a metallic carrier for making electrical contact and mechanically securing a first sensor on the supporting circuit board;
    a second mechanical insert part designed as a bus bar connecting, mechanically and in an electrically conductive manner, a second sensor to the supporting circuit board; and
    one-piece encapsulation comprising a curable encapsulation material, the one-piece encapsulation surrounding in a form-fitting and cohesive manner, all of the components arranged on the populated flat side of the supporting circuit board.

2. The mechatronic assembly of claim 1, wherein the encapsulation is formed of a curable encapsulation material.

3. The mechatronic assembly of claim 2, wherein the curable encapsulation material comprises a thermosetting plastic.

4. The mechatronic assembly of claim 2, wherein the curable encapsulation material incorporates at least one inorganic filler material.

5. The mechatronic assembly of claim 1, wherein the encapsulation has at least one reinforcing rib.

6. The mechatronic assembly of claim 1, wherein the encapsulation at least partially encloses a flat side of the supporting circuit board arranged opposite the populated flat side thereof.

7. The mechatronic assembly of claim 1, further comprising:
    an electric circuit arrangement with an electronic assembly; and
    at least one sensor.

8. The mechatronic assembly of claim 7, further comprising a printed circuit board element arranged between the electric circuit arrangement.

9. A method for the production of a mechatronic assembly of a gear control arrangement, the method comprising:
    providing a supporting circuit board having at least one flat side that is populated with a plurality of electronic components;
    mechanically fixing the at least one electronic component to the flat side of the supporting circuit board by a first mechanical insert part, the first mechanical insert part arranged on the at least one populated flat side, the first mechanical insert part designed as a hybrid injection-molded part and comprising a metallic carrier for making electrical contact and mechanically securing a first sensor on the supporting circuit board;

connecting, mechanically and in an electrically conductive manner a second sensor to the supporting circuit board by a second mechanical insert part designed as a bus bar; and applying a curable one-piece encapsulation to the plurality of electronic components including the first and second mechanical insert parts which material, upon curing, bonds with the electronic components and the first and second mechanical insert parts in a form-fitting and cohesive manner, and encapsulates the latter in a one-piece arrangement.

10. The method of claim 9, further comprising:

packing the curable encapsulation material in a mold; and immersing the supporting circuit board with its populated flat side in the mold.

11. The method of claim 9, further comprising spraying the curable encapsulation material onto the populated flat side of the supporting circuit board.

* * * * *